United States Patent [19]
Nakasuji et al.

[11] Patent Number: 6,124,596
[45] Date of Patent: Sep. 26, 2000

[54] CHARGED-PARTICLE-BEAM PROJECTION APPARATUS AND TRANSFER METHODS

[75] Inventors: Mamoru Nakasuji, Yokohama; Shohei Suzuki, Tokyo, both of Japan

[73] Assignee: Nikon Corporation, Tokyo, Japan

[21] Appl. No.: 09/140,622

[22] Filed: Aug. 26, 1998

[30] Foreign Application Priority Data

Aug. 28, 1997 [JP] Japan .................................. 9-245915

[51] Int. Cl.$^7$ .................................................. H01J 37/141
[52] U.S. Cl. .................................. 250/396 ML; 250/398
[58] Field of Search ........................ 250/396 R, 396 ML, 250/492.2, 398

[56] References Cited

U.S. PATENT DOCUMENTS

| | | | |
|---|---|---|---|
| 4,162,403 | 7/1979 | Baumgarten | 250/310 |
| 4,730,900 | 3/1988 | Uehara et al. | |
| 5,117,255 | 5/1992 | Shiraishi et al. | |
| 5,136,167 | 8/1992 | Langner et al. | 250/396 R |
| 5,466,904 | 11/1995 | Pfeiffer et al. | 250/396 ML |
| 5,581,324 | 12/1996 | Miyai et al. | |
| 5,677,757 | 10/1997 | Taniguchi et al. | |
| 5,905,267 | 5/1999 | Muraki | 250/492.22 |

OTHER PUBLICATIONS

Binder et al., "Accuracy requirements for adjusting variable–shaped beam systems for the production of submicron patterns," *J. Vac. Sci. Technol.*, vol. 16, No. 6, pp. 1723–1725, Nov/Dec 1979.

Liddle et al., "Mask fabrication for projection electron–beam lithography incorporating the SCALPEL technique," *J. Vac. Sci. Technol. B.*, vol. 9, No. 6, pp. 3000–3004, Nov/Dec 1991.

*Primary Examiner*—Bruce C. Anderson
*Attorney, Agent, or Firm*—Klarquist Sparkman Campbell Leigh & Whinston, LLP

[57] ABSTRACT

The present invention provides CPB projection apparatus and transfer methods for transferring a pattern from a mask onto a wafer with precise linear-distortion correction of transferred images without creating significant astigmatic blur of the image. A preferred embodiment of the projection apparatus includes an illumination-optical system and a projection-optical system. The illumination-optical system includes a CPB source for emitting a charged-particle beam, and first and second condenser lenses. A field-limiting aperture limits the field of the charged-particle flux. A first astigmatic-aberration correction coil is positioned at a principal plane of either the first or second projection lens and corrects linear distortion of a resulting projected image. A third condenser lens collimates the beam to form an image of the field-limiting aperture on a selected subfield of the mask. A projection-lens system demagnifies the image formed by the mask and projects the demagnified image on a wafer. A crossover aperture is positioned between the projection-lens system to further shape the CPB flux. A second astigmatic-aberration-correction coil is positioned parallel with the crossover aperture to correct astigmatic blur.

16 Claims, 5 Drawing Sheets

CHARGED-PARTICLE-BEAM PROJECTION APPARATUS AND TRANSFER METHODS

TECHNICAL FIELD OF THE INVENTION

The invention pertains to charged-particle-beam projection-microlithography apparatus and transfer methods for transferring a pattern from a mask onto a sensitized substrate. More specifically, the invention pertains to projection apparatus and transfer methods that perform precise astigmatic-aberration correction of transferred images with reduced levels of astigmatic blur.

BACKGROUND OF THE INVENTION

In charged-particle-beam (CPB) projection microlithography as used in the fabrication of integrated circuits, a circuit pattern defined by a reticle or mask is irradiated with a charged-particle beam to transfer the pattern defined by the reticle or mask to a sensitized substrate (e.g., a semiconductor wafer). In recent years, CPB projection-microlithography apparatus ("pattern-transfer apparatus") have been developed that exhibit improved resolution of the transferred pattern and improved product throughput (i.e., the number of semiconductor wafers that can be exposed with a pattern per unit time). With certain conventional CPB pattern-transfer apparatus, one or more entire die patterns defined on a mask are transferred onto the wafer in a single exposure. A "die" is a pattern coextensive with the bounds of an integrated circuit or other device to be transferred onto the wafer (usually multiple dies are exposed at respective locations on the wafer).

It is difficult to produce a mask for a CPB pattern-transfer apparatus that transfers multiple dies or even an entire die in a single exposure while also providing the high resolution and circuit densities demanded in recent years. In addition, conventional CPB pattern-transfer apparatus that transfer multiple dies or an entire die pattern per exposure cannot satisfactorily control aberrations that arise in the CPB optical system through which the charged-particle beam passes, especially over a large optical field covering one or more dies. To solve this problem, CPB pattern-transfer apparatus have been proposed in which a pattern to be transferred is divided into multiple field segments ("mask subfields") that are exposed individually and separately. Such a pattern is transferred typically using a "step-and-repeat" transfer scheme in which the individual mask subfields are sequentially transferred to corresponding "substrate subfields" on a wafer or other sensitized substrate. The substrate subfields are produced on the wafer surface in locations relative to each other such that the substrate subfields are "stitched" together in the correct order and alignment to reproduce the entire die pattern on the wafer surface (e.g., see U.S. Pat. No. 5,260,151).

A demagnifying (or "reduction") pattern-transfer apparatus irradiates a charged-particle beam onto a portion of a mask defining a circuit pattern of an entire die. An image of the die pattern is then demagnified and formed on the wafer (e.g., see Japanese Laid Open Patent Document No. HEI 5-160012). Because a die pattern image cannot be transferred to the wafer with sufficiently high resolution when irradiating the entire die pattern in a single exposure, a step-and-repeat transfer scheme is used to transfer the die pattern to the wafer subfield-by-subfield.

A mask for use with a "partial-batch" pattern-transfer method defines a repeating pattern portion of an integrated circuit, such as a DRAM, and non-repeating patterns. The mask is irradiated and the pattern portion to be repeatedly transferred to the wafer is reduced and transferred thereto the desired number of times. The non-repeating pattern portions of the mask undergo direct writing to the wafer (i.e., the patterns are not reduced), typically using a conventional variable-shaped-beam method. The partial-batch pattern transfer method improves wafer throughput in comparison to a variable-shaped-beam method.

In conventional CPB projection-microlithography apparatus employing a reduction pattern-transfer method, the transferred image typically encounters linear distortion. For example, linear distortion of a square image may result in a transferred image having a rectangular or parallelogram transverse profile rather than a square transverse profile. Conventionally, astigmatic-aberration correction coils are used in CPB projection apparatus to correct linear distortion of the projected images. The correction coils normally are situated in any of various locations in such apparatus. (The optimal positions of the correction coils is unclear from the teachings of the prior art). With the prior art apparatus, correction of linear distortion using astigmatic-aberration correction coils results in an image experiencing secondary astigmatic aberration (astigmatic blur), producing a transferred image having poor resolution due to blurring of the image edges. However, attempts to correct the astigmatic blur of the image edges typically result in further linear distortion of the image.

Further, the conventional method used to measure linear distortion of a projected image involves projection of an enlarged image onto a fluorescent-light panel. The projected image is then viewed by eye to determine the extent the image has experienced linear distortion (e.g., J. Vac. Sci. Tech. 16 (60):1723 November/December 1979). Accordingly, to perform a conventional linear-distortion measurement method, two lenses and a fluorescent-light panel must be placed on a lower portion of a sensitive-substrate mounting surface. Such apparatus requirements result in a larger, more complex, and expensive projection apparatus. Additionally, because the extent of linear distortion of a projected image is determined by eye, the prior art methods for measurement of linear distortion lack precision and/or accuracy.

Accordingly, there is a need for CPB projection-microlithography apparatus and transfer methods for transferring a pattern from a mask onto a sensitized substrate with precise correction of linear distortion of the transferred images and without the creation of significant astigmatic blur of the transferred image.

SUMMARY OF THE INVENTION

In light of the foregoing deficiencies in the prior art, the present invention provides charged-particle-beam (CPB) projection-microlithography apparatus (projection apparatus) and transfer methods for transferring a pattern from a mask onto a sensitized substrate with precise linear-distortion correction of transferred images and without the creation of significant astigmatic blur of the transferred image resulting from the initial linear-distortion correction. The projection apparatus and transfer methods of the present invention provide for demagnified pattern transfer of linear-distortion-corrected images onto a substrate, with high accuracy and throughput.

More specifically, a preferred embodiment of a projection apparatus according to the present invention comprises, along an optical axis in the trajectory direction of an electron beam, an illumination-optical system, at least one astigmatic-aberration-correction (AAC) coil, and a projection-optical system. The illumination-optical system comprises an electron gun (or other suitable CPB source) and first and second condenser lenses positioned downstream of the electron gun. The illumination-optical system further comprises a field-limiting aperture, preferably positioned downstream of the first and second condenser lenses to limit the transverse field of an electron flux, emitted from the electron gun, to a desired dimension. A first deflector preferably is positioned downstream of the field-limiting aperture to selectively scan the electron beam to expose selected subfields of a mask. A third condenser lens is positioned downstream of the first deflector to converge the electron beam, make the beam parallel to the optical axis, and form an image of the field-limiting aperture on the mask. The AAC coil is positioned preferably at the principal plane of the first or second projection lens to correct linear distortion.

The projection-optical system positioned downstream of the illumination-optical system comprises two projection lenses to demagnify the image formed by the mask and to project the demagnified image onto a sensitive-substrate surface, such as a wafer. A crossover aperture is positioned between the projection lenses to further shape the electron-beam flux. A second AAC coil, if required for correction of astigmatic blur, is positioned at and parallel with the crossover aperture to correct the astigmatic blur caused by the initial linear-distortion correction. A third deflector is positioned downstream of the crossover aperture to deflect the electron beam over the wafer when adjusting the electrical current levels supplied to the first and second AAC coils.

In general, a preferred embodiment of a mask-pattern transfer method according to the present invention comprises emitting an electron beam (or other charged-particle beam) and transmitting the beam through an illumination-optical system. The electron beam is scanned to selectively illuminate mask subfields. The mask-pattern segment in each subfield is sequentially transferred onto a wafer (or other sensitive substrate) through a projection-optical system (typically having a demagnification ratio of less than unity). As the electron beam is scanned across the mask, the first AAC coil is selectively energized to eliminate linear distortion of the projected image. The optimal directions and magnitudes of electrical current for operation of each of the coil sets in the first AAC coil to eliminate linear distortion preferably are determined prior to irradiating the mask-subfield patterns.

The foregoing and other objects, features, and advantages of the invention will become more apparent from the following detailed description of preferred embodiments which proceed with reference to the accompanying drawings.

DETAILED DESCRIPTION OF THE INVENTION

Figure 2:
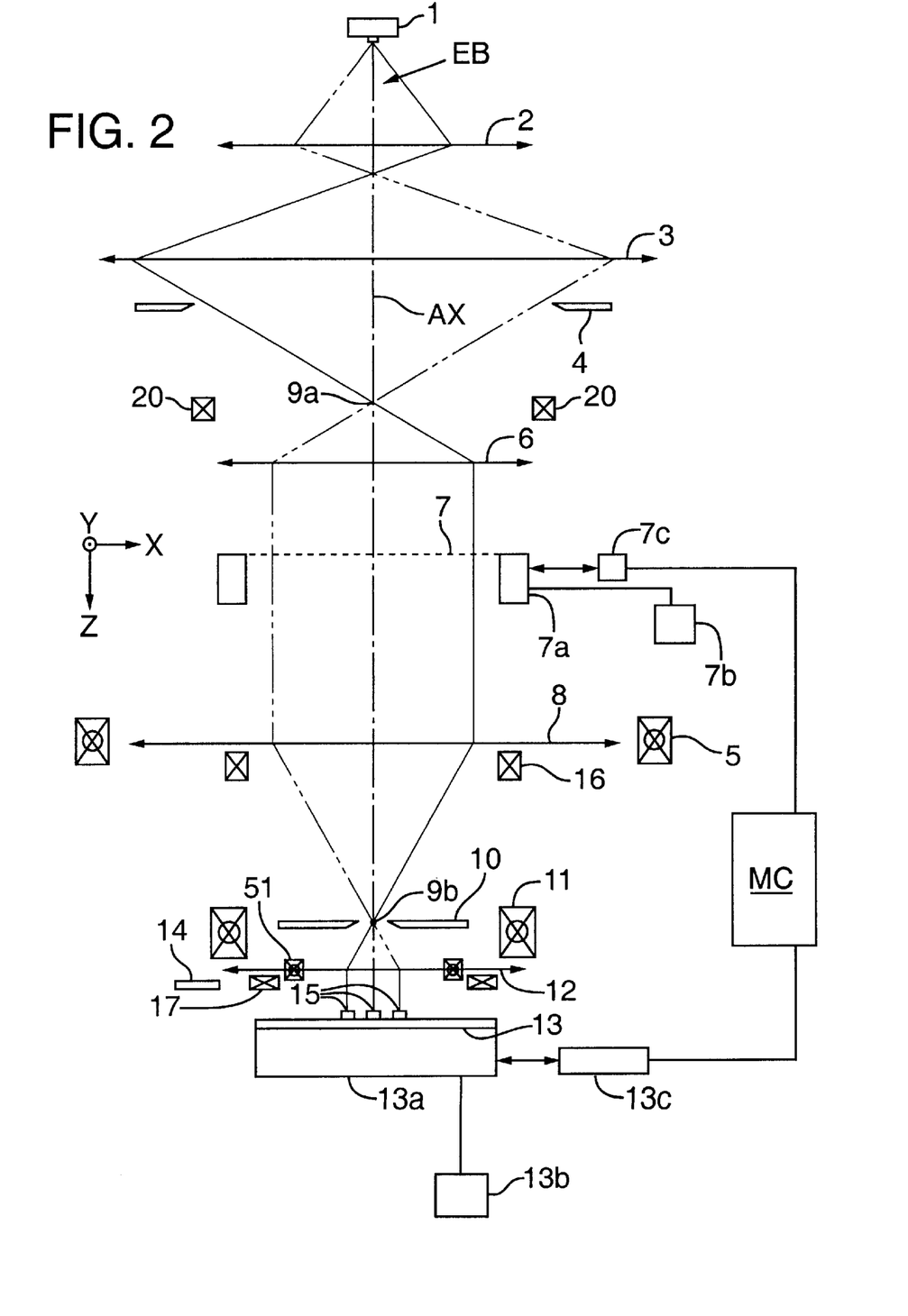
FIG. 2 is an elevational schematic diagram of a first embodiment of a charged-particle-beam (CPB) projection apparatus according to the present invention.

A first embodiment of a charged-particle-beam (CPB) projection-microlithography apparatus (projection apparatus) according to the present invention is shown in FIG. 2. In FIG. 2, the Z-axis is parallel to the initial trajectory axis (optical axis AX) of an electron beam EB, the X-axis extends in a direction horizontal with the plane of the page, and the Y-axis extends in a direction perpendicular to the plane of the page.

Although the present invention is described primarily with reference to use of an electron-beam apparatus with a mask, it will be understood by those persons skilled in the art that the apparatus and methods of the present invention apply equally well to other CPB apparatus and CPB reticles, respectively.

Referring to FIG. 2, the first embodiment of the projection apparatus of the present invention comprises, along the optical axis AX in the trajectory direction of an electron beam EB, an illumination-optical system, at least one astigmatic-aberration-correction (AAC) coil, and a projection-optical system. The illumination-optical system preferably comprises an electron beam source 1 (e.g., an electron gun) for emitting the electron beam EB. The illumination optical system further comprises first and second condenser lenses 2, 3 both positioned downstream of the beam source 1 to focus the electron beam EB and irradiate the beam in a direction toward a mask 7 (the mask is not part of the illumination-optical system). The first and second condenser lenses 2, 3 create an electron-beam crossover 9a downstream of the second condenser lens 3. The electron-flux current (i.e., the irradiation density) illuminating the mask 7 may be controlled by setting the magnification ratio of the condenser lenses 2, 3 in a coordinated manner such that the condenser lenses collectively function as a zoom lens.

The illumination-optical system further comprises a field-limiting aperture 4 positioned downstream of the first and second condenser lenses 2, 3. The field-limiting aperture 4, preferably rectangular in transverse profile, limits the transverse profile of the divergent electron beam transmitted by the first and second condenser lenses 2, 3 to dimensions equal to the size of a mask subfield.

A first deflector 20 is positioned preferably downstream of the field-limiting aperture 4 to selectively scan the electron beam EB along the X-axis direction, and sequentially expose the mask subfields. A third condenser lens 6 is positioned downstream of the field-limiting aperture 4 and the first deflector 20 to converge the electron beam EB, make the beam parallel to the optical axis AX, and thereafter form an image of the field-limiting aperture 4 on the mask 7. The third condenser lens 6 and the first AAC coil 5 are controlled such that a crossover 9b is created at a crossover aperture 10 positioned downstream of the mask 7.

The mask 7 pattern is divided into multiple strips and each strip on the mask comprises multiple main fields. Each main field on the mask, in turn, comprises multiple subfields. The mask 7 is preferably mounted on a mask stage 7a so as to be parallel to the XY plane. The mask stage 7a, preferably driven by a mask-stage driver 7b, is movable in the X-axis and Y-axis directions. The mask stage 7a moves the mask 7 along the X-axis and Y-axis directions (at right angles to the optical axis) while a first laser interferometer 7c determines the position of the mask stage 7a. The first laser interferometer 7c is electrically connected to a master controller MS to provide data to the master controller indicative of the detected position of the mask stage 7a.

A sensitive substrate 13 (e.g., wafer) is mounted preferably on a wafer stage 13a parallel to the XY plane. The wafer stage 13a, preferably driven by a wafer-stage driver 13b, is movable in the X-axis and Y-axis directions. The position of the wafer stage 13a is detected by a second laser interferometer 13c that is, in turn, connected to the master controller MS. The second laser interferometer 13c provides data indicative of the detected position of the wafer stage 13a.

Referring further to FIG. 2, the projection-optical system is positioned downstream of the illumination-optical system. The projection-optical system comprises first and second projection lenses 8, 12 positioned downstream of the mask 7 and a crossover aperture 10. The projection lenses 8, 12 receive the electron beam EB transmitted through a selected subfield of mask 7 and form a demagnified image of the subfield pattern onto the wafer 13. Each line indicating a respective projection lens 8, 10 also indicates the respective principal plane of the respective projection lens.

The projection apparatus further comprises a first AAC coil 5 to correct for linear distortion of a transferred image. The first AAC coil 5 is situated preferably at the principal plane of the first projection lens 8 for maximal efficiency of correction of linear distortion. At such a position, the AAC coil 5 is situated axially midway between the mask 7 and the crossover 9b.

Alternatively, especially for apparatus comprising only one AAC coil, the first AAC coil 5 can be situated at the principal plane of the second projection lens 12. This configuration is shown in FIG. 2, in which a first AAC coil (denoted as item 51) is shown at the principal plane of the second projection lens 12. Such a position also affords maximal efficiency of correction of linear distortion. At such a position, the first AAC coil 51 is situated axially midway between the crossover 9b and the wafer 13.

The crossover aperture 10 is positioned intermediate the two projection lenses 8, 12 downstream of the mask 7, at crossover 9b, preferably located a distance upstream of the wafer 13 equal to the distance between the mask 7 and the wafer 13 multiplied by the demagnification ratio. The crossover aperture 10 has a transverse profile that is sized to block the transmission of stray electron flux, and produce a crisp image of the irradiated mask subfield on the desired location ("transfer subfield") on the wafer 13.

The projection apparatus further comprises a second deflector 16 positioned between the projection lenses 8, 12 to deflect the electron beam EB at the crossover 9b when adjusting the first AAC coil 5 (discussed below).

Figure 3A:
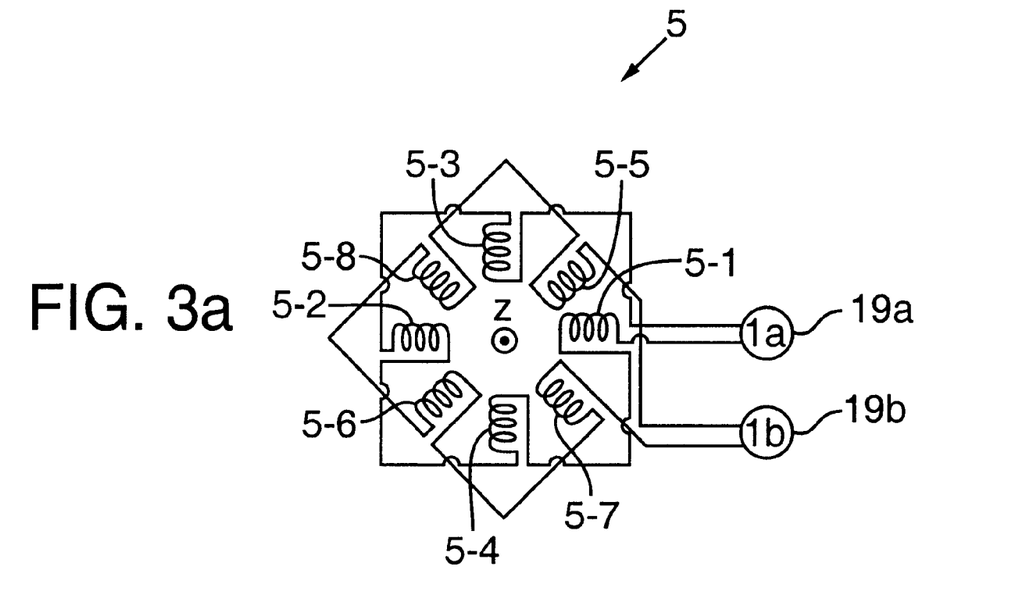
FIG. 3a is a plan view of an embodiment of the coil sets of an astigmatic-aberration correction (AAC) coil of the CPB projection apparatus shown in FIG. 2.

A preferred embodiment of the first AAC coil 5 is shown in FIG. 3a. The first AAC coil 5 includes two sets of four-pole coils. The first set consists of poles 5-1 through 5-4, and the second set consists of poles 5-5 through 5-8. The poles are preferably positioned radially about the optical axis AX (i.e., the Z-axis in FIG. 3a). The angle between each of the poles is preferably about 45°.

For each set of four-pole coils, each pole 5-1 through 5-8 is directly electrically connected to the poles of the same set oriented at 90° and 180° from the pole. Preferably, the two sets of poles are electrically connected to and controlled by respective power supplies 19a, 19b. That is, poles 5-1, 5-3, 5-2, and 5-4 are electrically connected to the one another in series and are connected to power supply 19a, and poles 5-5, 5-7, 5-6, and 5-8 are electrically connected to one another in series and are connected to the power supply 19b. The power supplies 19a and 19b are preferably controlled independently of each other.

The preferred embodiment of the apparatus also comprises a second AAC coil 11 are positioned at the crossover 9b and preferably parallel with the crossover aperture 10. The configuration of the second AAC coil 11 is preferably identical to that of the first AAC coil 5. The second AAC coil 11, if required, substantially eliminates any astigmatic blur caused by the initial correction of linear distortion by the first AAC coil 5 or 51. I.e., the preferred embodiment comprises a combination of the second AAC coil 11 with either the first AAC coil 5 or the first AAC coil 51 positioned as shown in FIG. 2 (discussed below). It will be understood that the second AAC 11 can have the same general configuration as the first AAC coil 5 shown in FIG. 3a.

A third deflector 17 is positioned preferably downstream of the second projection lens 12 to scan the electron beam over the wafer 13 when performing adjustment of the current levels supplied to the first and second AAC coils. An electron-beam detector 14 is positioned downstream of the projection lens 12 to detect electrons reflected from the surface of the wafer 13 during such adjustment.

The upstream-facing surface of the wafer 13 is coated typically with a suitable resist or other "sensitizing" substance that is sensitive to exposure to electrons in the electron beam EB in an image-forming way.

Figure 1:
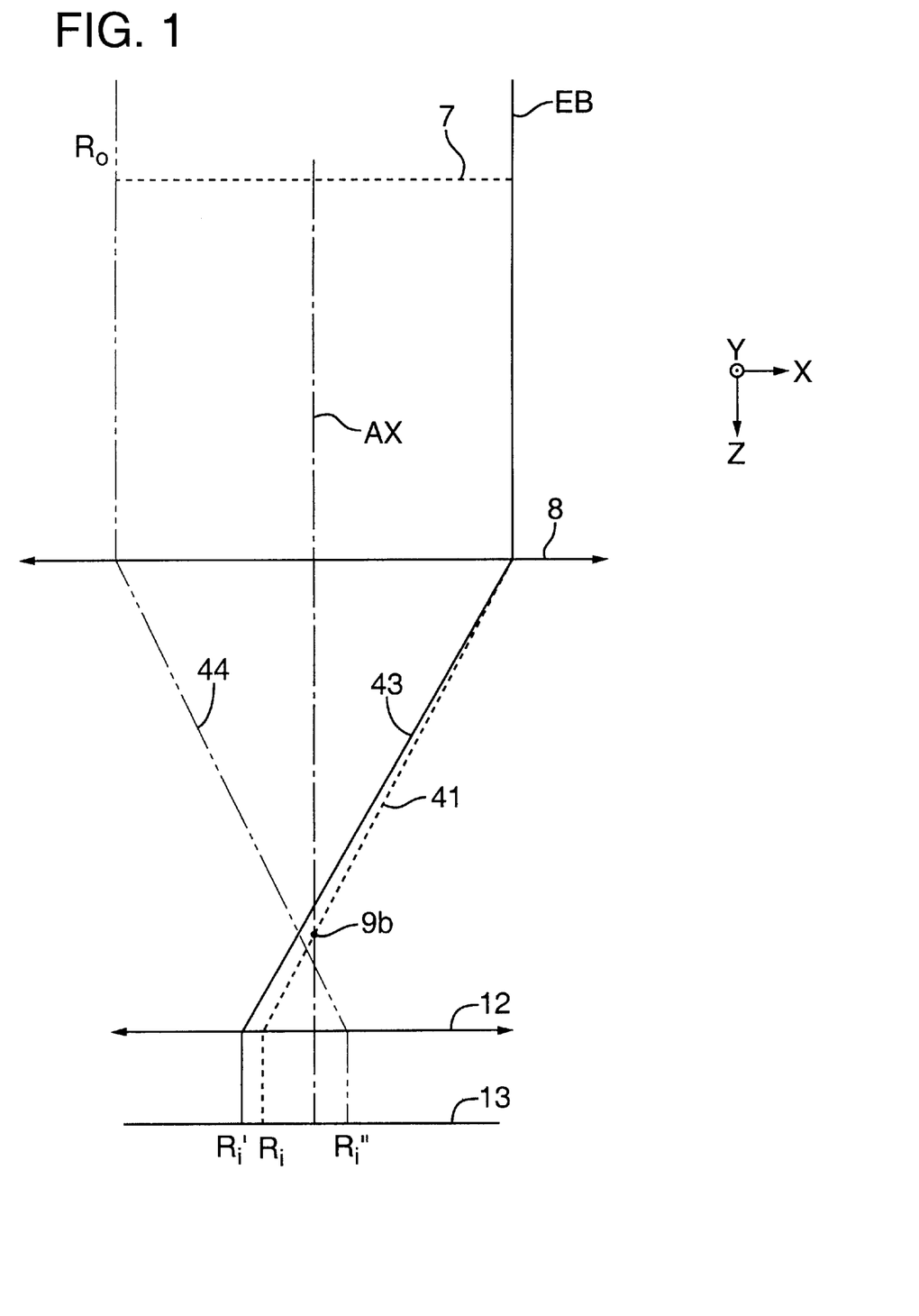
FIG. 1 is an elevational partial schematic diagram for depicting certain principles concerning the generation of linear distortion of a transferred image.

Referring to FIG. 1, a principle by which linear distortion is generated is illustrated. As an electron beam EB illuminates a mask 7, it is transmitted through the mask pattern to two projection lenses 8, 12. The projection lenses 8, 12 transmit the electron beam EB in the form of a projected image of the mask pattern (typically a demagnified pattern image), onto a wafer 13. Whenever the electron beam EB projected by the first projection lens 8 does not experience any linear distortion, the electron beam EB projected by the first projection lens 8 forms the crossover 9b, as shown by a dashed line 41, to illuminate the wafer 13 at position $R_i$, wherein $R_o/R_i$ is equal to the demagnification ratio of the projection apparatus (e.g., ¼).

If an astigmatic aberration exists between the projection-optical system the transferred mask-pattern image will experience linear distortion. For example, in FIG. 1, as shown by solid line 43, the electron beam EB transmitted through the mask 7 along the Z-axis (vertical to the mask surface), follows a path that crosses the optical axis AX at a position upstream of the crossover 9b. The electron beam EB then exposes the surface of the wafer 13 at position $R_i'$ rather than at position $R_i$ (i.e., $R_i'>R_i$).

As indicated by a double-dashed line 44, the electron beam EB transmitted by the mask 7 along the Z-axis (vertical to the mask), follows a path that crosses the optical axis AX at a position downstream of the crossover 9b. The electron beam EB then exposes the surface of the wafer 13 at position $R_i''$ rather than at position $R_i$ (i.e., $R_i''<Ri$). Accordingly, although the illuminated subfield on the mask 7 has a square transverse profile, the subfield image formed on the wafer 13 has a rectangular transverse profile that is longer in the Y-axis direction. That is, whenever astigmatic aberration is manifest at the crossover 9b, linear distortion of the transferred image causes a square-shaped mask subfield of the mask to produce a rectangular-shaped transferred image on the wafer. Likewise. astigmatic aberration in an angular direction at the crossover results in linear distortion that causes a square transverse profile mask subfield to produce a transferred image having a parallelogram-shaped transverse profile.

By plinear d of the AAC coils 5 (or 51) and 11 as shown in FIG. 2, linear distortion at the wafer 13 is substantially eliminated. That is, the first AAC coil 5 or 51 is positioned preferably at the principal plane of the first projection lens 8 or second projection lens 12, respectively. At such respective positions, correction of linear distortion can be performed with maximal efficiency. Also, when the first AAC coil 5 or 51 is located at a respective principal plane, the magnitude of electrical current supplied to the first AAC coil 5 or 51 is minimal. This results in minimal generation of astigmatic blur to be corrected by the second AAC coil 11. For correction of astigmatic blur, similarly, the second AAC coil 11 is positioned preferably at the crossover aperture 10 (FIG. 2).

In general, a mask pattern is transferred by the projection apparatus of the present invention as follows, referring to the representative embodiment of FIG. 2. An electron beam EB emitted from the electron gun 1 is transmitted through the first and second condenser lenses 2, 3 and the field-limiting aperture 4. The first deflector 20 scans the electron beam through the third condenser lens 6 sequentially along the multiple "strips" on the mask. By moving the mask stage 7a and the wafer stage 13a in opposing Y-axis directions, each of the principal fields in the strips of the mask pattern are continuously exposed. Exposure of each strip is performed by intermittently moving both the mask stage 7a and the wafer stage 13a in opposing X-axis directions. By adjustment of the first deflector 20, each of the mask subfields may be transferred to and accurately stitched together on the wafer 13. A first laser interferometer 13c may be used to detect the position of the wafer stage 13a.

As the electron beam EB is scanned across the mask 7, the first and second AAC coils 5 (or 51) and 11 are operated to eliminate linear distortion of the projected image. To eliminate linear distortion of projected images, the optimal electrical current levels for operation of each of the AAC coils 5 (or 51) and 11 are determined prior to irradiating the mask subfield patterns. In general, multiple evaluation marks are located on the mask 7 and at least one evaluation mark is located on the wafer 13. The AAC coils 5 (or 51) and 11 are operated at various respective electrical-current levels as required while the evaluation marks on the mask are illuminated by the electron beam EB. The extent of any linear distortion of the resulting image for each set of electrical current levels is determined by detecting electrons reflected by the surface of the wafer 13 and appropriate adjustment of the respective direction and magnitude of electrical current supplied to each of the AAC coils 5 (or 51) and 11 is made to eliminate linear distortion.

Figure 3B:
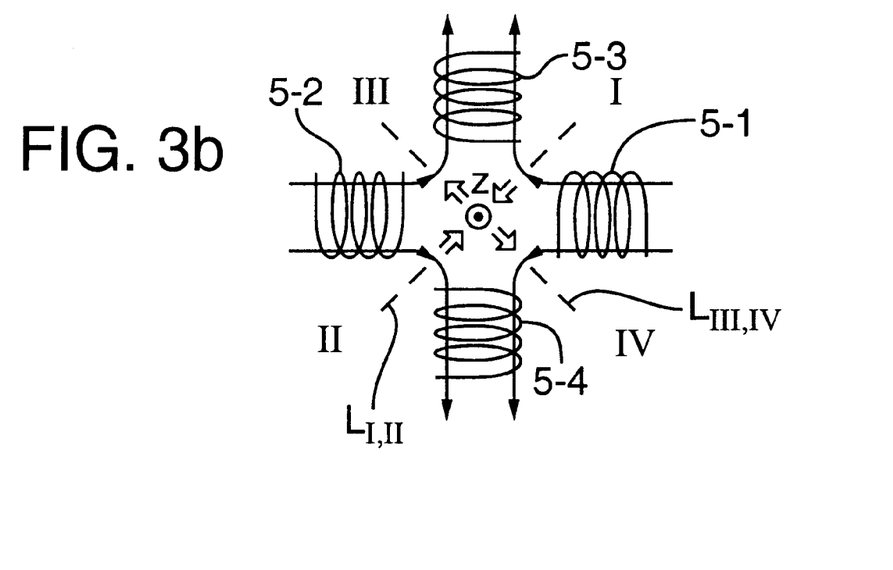
FIG. 3b is a schematic of the coil sets of an AAC coil illustrating the functioning principles of the coil sets.

FIG. 3b illustrates the effects of operation of an AAC coil. In FIG. 3b the coil set consisting of poles 5-1 through 5-4 of FIG. 3a is shown. The poles 5-1 through 5-4 are electrically connected in series. As electrical current flows through the respective coil of each pole, respective magnetic fluxes (defined by generated lines of magnetic force) are generated (as shown in FIG. 3b by the solid lines with arrows). The magnetic fluxes affect the electron beam that passes in the vicinity of the optical axis in the trajectory direction according to Fleming's Rule (i.e., the Left-Hand Rule). As a result, the electron beam is deflected in the directions indicated by the open-centered arrows in FIG. 3b.

Accordingly, in regions I and II, the electron beam is urged by the magnetic flux toward the optical axis. In regions III and IV, the electron beam is urged by magnetic force moving away from the optical axis. As a result, the electron beam passing through the AAC coil shown in FIG. 3b is compressed in a first direction (regions I and II), and is expanded in a second direction (regions III and IV), wherein a line $L_{I,II}$ passing through regions I and II is oriented at about 90° to a line $L_{III,IV}$ passing through regions III and IV. Thus, any astigmatic aberration extending in a direction opposite to a direction in which the beam is expanded or contracted is canceled. A similar astigmatic aberration correction is imparted by the coil set consisting of poles 5-5 through 5-8. Accordingly, by controlling the magnitude and direction of the electrical current supplied by the power supplies 19a and 19b to the respective coil sets the astigmatic aberration in one or more directions, may be corrected.

A first method for adjusting the AAC coils 5 (or 51) and 11 for correction of astigmatic aberration is described with reference to the FIG. 2 embodiment of the projection apparatus. An electron beam EB is emitted toward and transmitted by the illumination-optical system (comprising lenses 2, 3, 6), to be incident upon a selected subfield of the mask 7. The beam transmitted through the mask 7 propagates to the first projection lens 8 of the projection-optical system. The electron beam transmitted by the first projection lens 8 is scanned in the X-axis and Y-axis directions at the crossover aperture 10 by the second deflector 16. The portion of the electron beam that passes through the crossover aperture 10 is then projected by the second projection lens 12 to transfer an image of the crossover 9b onto a respective transfer subfield on the wafer 13.

Electrons reflected by the surface of the wafer 13 are detected by the electron-beam detector 14. Dimensions of the image of the crossover 9b in the X-axis direction and Y-axis direction are determined from the waveforms of the detected reflected electrons. The magnitudes of electrical current supplied to the first AAC coil 5 and the third condenser lens 6 are then adjusted so that the dimensions of the image of the crossover 9b (and hence the crossover 9b itself) are as small as possible. By limiting the transverse dimensions of the crossover 9b, linear distortion of projected images is substantially eliminated.

Correction of linear distortion using the first AAC coil 5 (or 51) typically causes some shifting of the position of the crossover 9b in the Z-axis direction. Such a shift, however, may be corrected by adjusting the magnitude of electrical current supplied to the third condenser lens 6. That is, the position of the crossover 9b may be shifted transversely by varying the electrical current applied to the third condenser lens 6.

A second (and more accurate) method for adjusting the AAC coils for correction of linear distortion of projected images includes the use of several evaluation marks 15 situated on the surface of the wafer 13. The selected mask subfield is projected and imaged "near" the marks 15 on the wafer surface. (By "near" in this context is meant closer than the pitch of the evaluation marks 15.) The electron beam is scanned across the selected mask subfield and the marks 15 using the third deflector 17. Four positions of the selected subfield image are measured and the extent of linear distortion of the image is evaluated by detecting the reflected electrons off of the evaluation marks. Any detected linear distortion of the subfield image is corrected by adjusting the magnitudes and directions of electrical currents supplied to the first AAC coil 5 (or 51) and the third condenser lens 6.

At the same time, the second AAC coil 11, positioned parallel with the crossover aperture 10, can be used to correct astigmatic blur. The astigmatic blur is corrected by evaluating the beam-edge resolution of the projected image (FIG. 4) by the evaluation marks 15 on the wafer. That is, astigmatic blur causing deterioration of the resolution of the beam-image edge (due to, e.g., correcting linear distortion with the first AAC coil 5 of 51) is substantially eliminated by adjusting the magnitudes and directions of electrical currents supplied to the coil sets of the second AAC coil 11. Because the second AAC coil 11 is arranged preferably parallel to with the crossover aperture 10, there is no bending effect of the electron beam crossing the optical axis AX, as is experienced with the correction performed with the first AAC coil 5 (or 51). Accordingly, adjustment of astigmatic aberrations using the second AAC coil 11 does not introduce further distortion of the projected image.

A third embodiment of the method for adjusting the AAC coils to effect correction of astigmatic aberration of projected images is described with reference to the first embodiment of the projection apparatus shown in FIG. 2, with further reference to FIGS. 4, 5, and 6.

Figure 4:
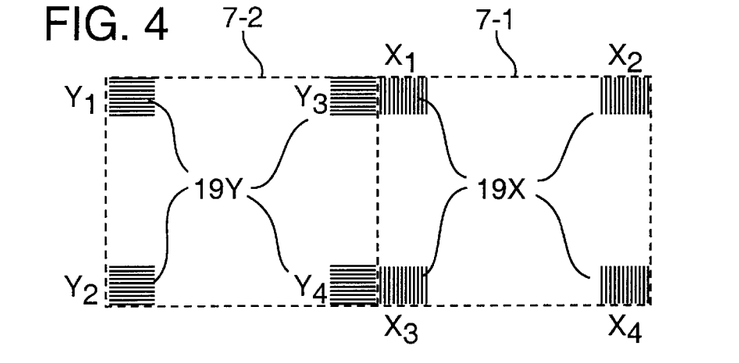
FIG. 4 is an enlarged plan view of a CPB pattern used for the correction of linear distortion of projected images.
Figure 5:
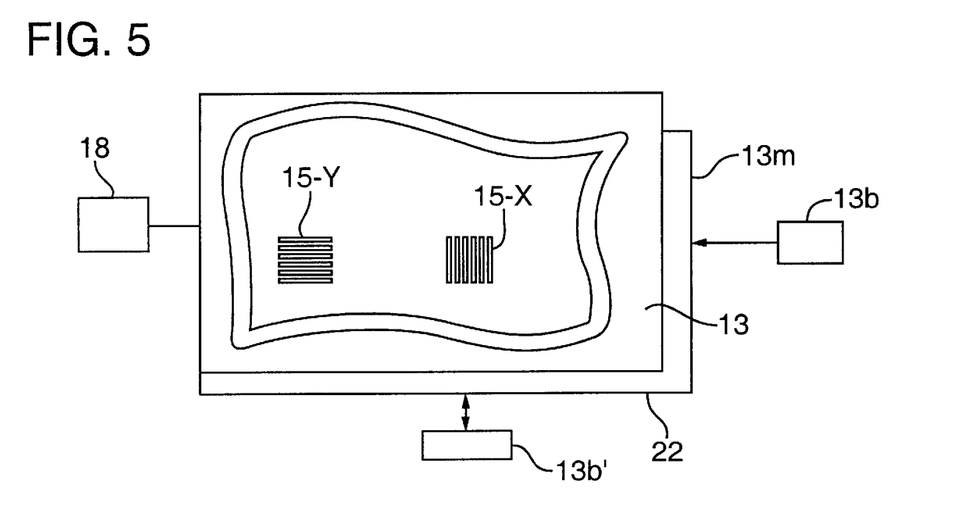
FIG. 5 is an enlarged plan view of a CPB pattern used for the correction of linear distortion of projected images.

As shown in FIG. 4, mask-evaluation marks 19X, 19Y are located on two adjacent subfields 7-1, 7-2, respectively, of the mask 7, for measuring the X-axis and Y-axis directions of the electron-beam position. Each mask-evaluation mark 19X, 19Y comprises multiple slits extending in either the Y-axis direction or X-axis direction, respectively. As shown in FIG. 5, a wafer-evaluation mark 15-X for evaluating the X-axis position of the electron beam, and a wafer-evaluation mark 15-Y for evaluating the Y-axis position of the beam, are located on the wafer 13. The wafer-evaluation marks 15-X, 15-Y are located preferably on the wafer at positions sufficiently distant from one another (preferably a distance greater than a dimension of a subfield). Like the mask-evaluation marks 19X and 19Y, each wafer-evaluation mark 15-X, 15-Y comprises multiple slits extending in the Y-axis or X-axis directions, respectively. By moving the wafer stage 13a, the positions of the wafer-evaluation marks 15-X, 15-Y are moved and their positions are measured using laser interferometers 13b, 13b'. A mirror 13m may be attached to the wafer stage 13a to reflect the laser.

For example, assume that the magnitudes of electrical current supplied to the coil sets of the first AAC coil 5 are $I_a$ and $I_b$, respectively. When $I_a$ and $I_b$ are equal to $I_{a0}$ and $I_{b0}$, respectively the astigmatic aberration has been found to be relatively small at the crossover aperture 9a. The following relationships of electrical-current magnitudes have been found to be useful in determining the optimum magnitudes of electrical current for minimizing linear distortion. That is, the linear distortion is evaluated when the electrical-current magnitudes $I_a$ and $I_b$ are equal to:

$(I_{a0}+\epsilon, I_{b0})$, $(I_{a0}, I_{b0})$ $(I_{a0}-\epsilon, I_{b0})$, $(I_{a0}+\epsilon, I_{b0}+\epsilon)$, $(I_{a0}, I_{b0}+\epsilon)$, $(I_{a0}-\epsilon, I_{b0}+\epsilon)$, $(I_{a0}+\epsilon, I_{b0}-\epsilon)$, $(I_{a0}, I_{b0}-\epsilon)$, and $(I_{a0}-\epsilon, I_{b0}-\epsilon)$, wherein $\epsilon$ is the minimum increment of the AAC coil current.

Linear distortion $\Delta$ is defined by equation (1) as follows:

$$\Delta \equiv \{X_2-X_1)/4-(X_{2i}-X_{1i})\}^2 + \{(Y_2-Y_1)/4-(Y_{2i}-Y_{1i})\}^2 \quad (1)$$

wherein $X_1$ and $X_2$ are the respective center positions (in the X-axis direction) of the mask-evaluation marks 19X, 19Y on the mask; $Y_1$ and $Y_2$ are the respective center positions (in the Y-axis direction) of the patterns of the mask-evaluation marks; $X_{1i}$ and $X_{2i}$ are the respective positions of the $X_1$ and $X_2$ pattern images of the mask-evaluation marks formed on the wafer as measured along the X-axis; and $Y_{2i}$ and $Y_{1i}$ are the respective positions of the $Y_2$ and $Y_1$ pattern images of the mask-evaluation marks formed on the wafer as measured along the Y-axis, respectively.

Figure 6:
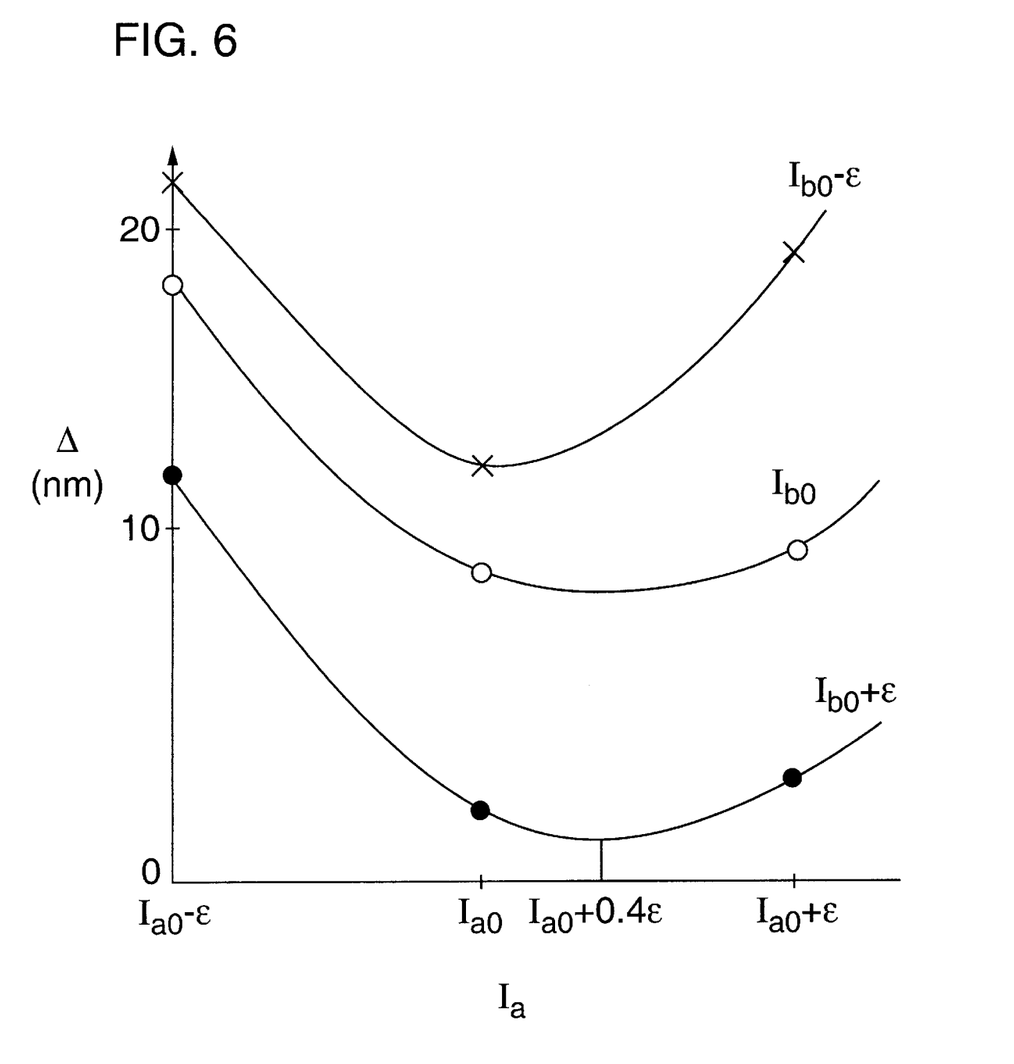
FIG. 6 is a graph illustrating measurement of the linear distortion of a projected image.

FIG. 6 illustrates a representative measurement of the extent by which an image has experienced linear distortion. The horizontal axis is the magnitude of electrical current $I_a$. Linear distortion $\Delta$ is plotted along the vertical axis. The measurements of electrical current are approximated using secondary curves. Accordingly, with respect to the bottom curve (wherein $I_b=I_{b0}+\epsilon$ and $I_a 32\ I_{a0}+0.4\epsilon$) the linear distortion $\Delta$ is at a minimum and an image having minimal linear distortion is obtained.

The present invention provides CPB microlithography apparatus and transfer methods that transfer highly precise mask-pattern images in which astigmatic aberrations are corrected and that exhibit minimal astigmatic blur or blurring.

Whereas the invention has been described with reference to multiple embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A charged-particle-beam projection-microlithography apparatus for transferring a mask pattern image to a sensitive substrate using a charged-particle beam, the apparatus comprising along an optical axis in the trajectory direction of the charged-particle beam:

(a) a charged-particle-beam source for emitting the charged-particle-beam;

(b) a first condenser lens for converging the charged-particle-beam at a first crossover;

(c) a field-limiting aperture for shaping a field, transverse to the optical axis, of the charged-particle beam and for transmitting the beam onto a region of a pattern defined by a mask;

(d) a projection-optical system, comprising first and second projection lenses, for imaging the charged-particle beam transmitted by the mask and projecting a demagnified mask-pattern image onto the sensitive substrate; and (e) a first astigmatic-aberration-correction coil positioned in a vicinity of a principal plane of either of the first and second projection lenses for correcting linear distortion of the demagnified mask-pattern image on the sensitive substrate, the first astigmatic-aberration-correction coil being connected to a plurality of power supplies so as to receive an electric current from the power supplies.

2. The apparatus of claim 1, further comprising a first scanner positioned between the field-limiting aperture and the mask for deflecting the charged-particle beam so that the beam scans the mask in a predetermined scanning direction.

3. The apparatus of claim 1, further comprising a second condenser lens positioned between the first condenser lens and the field-limiting aperture.

4. The apparatus of claim 1, further comprising a third condenser lens positioned downstream of the field-limiting aperture for collimating the charged-particle beam and forming an image of the field-limiting aperture on the mask.

5. The apparatus of claim 1, further comprising an evaluation mark on which the demagnified mask-pattern image is projected, the mark being mounted on a stage that supports the sensitive substrate.

6. The apparatus of claim 1, further comprising a second astigmatic-aberration-correction coil positioned downstream of the mask for correcting astigmatic blur of a projected mask-pattern image resulting from correction of the linear distortion using the first astigmatic-aberration-correction coil, the second astigmatic-aberration correction coil being connected to a plurality of power supplies to receive respective electric currents from the power supplies.

7. The apparatus of claim 6, further comprising an evaluation mark on which the demagnified mask-pattern image is projected, the mark being mounted on a stage that supports the sensitive substrate.

8. The apparatus of claim 7, further comprising a crossover aperture positioned intermediate the first and second projection lenses, wherein the second astigmatic-aberration-correction coil is axially positioned at and parallel with the crossover aperture.

9. The apparatus of claim 7, further comprising a crossover aperture positioned intermediate the first and second projection lenses, and a second scanner positioned between the first projection lens and the crossover aperture, the second scanner being for deflecting the charged-particle beam at a second charged-particle-beam crossover positioned at or near the crossover aperture.

10. The apparatus of claim 9, further comprising a third scanner positioned downstream of the second projection lens for deflecting the charged-particle-beam over the sensitive substrate whenever the respective electric currents applied to the first and second astigmatic-aberration-correction coils are adjusted.

11. The apparatus of claim 10, further comprising a charged-particle beam detector positioned downstream of the third scanner for detecting charged particles reflected from a surface of the sensitive substrate whenever the respective electric currents applied to the first and second astigmatic-aberration-correction coils are adjusted.

12. The apparatus of claim 1, wherein the first astigmatic-aberration-correction coil is positioned at the principal plane of the first projection lens.

13. The apparatus of claim 1, wherein the first astigmatic-aberration-correction coil is positioned at the principal plane of the second projection lens.

14. A charged-particle-beam projection-microlithography apparatus for transferring a mask pattern image to a sensitive substrate using a charged-particle beam, the apparatus comprising along an optical axis in a trajectory direction of the charged-particle beam:

(a) an illumination-optical system for illuminating a charged-particle beam onto a region of a pattern defined by a mask, the illumination-optical system defining a field-limiting aperture for shaping a field, transverse to the optical axis, of the charged-particle beam;

(b) a projection-optical system, comprising first and second projection lenses, for imaging the charged-particle beam transmitted by the mask and projecting a demagnified mask-pattern image onto the sensitive substrate, the projection-optical system defining a crossover aperture at a crossover, the crossover aperture being for limiting the field, transverse to the optical axis, of the charged-particle beam at the crossover;

(c) a first astigmatic-aberration-correction coil positioned at a principal plane of either of the first and second projection lenses for correcting linear distortion of the demagnified mask-pattern image at the crossover, the first astigmatic-aberration-correction coil comprising first and second coil sets each separately connected to a respective power supply to receive an electric current from the power supply; and (d) a second astigmatic-aberration-correction coil positioned at and parallel with the crossover aperture for correcting astigmatic blur of the demagnified mask-pattern image resulting from correction of linear distortion using the first astigmatic-aberration-correction coil, the second astigmatic-aberration-correction coil comprising first and second coil sets each separately connected to a respective power supply to receive an electric current from the power supply.

15. The apparatus of claim 14, further comprising an evaluation mark on which the demagnified mask-pattern image is projected so as to measure the linear distortion, the mark being mounted on a stage that supports the sensitive substrate.

16. The apparatus of claim 14, further comprising an evaluation mark on which the demagnified mask-pattern image is projected so as to measure the astigmatic blur, the mark being mounted on a stage that supports the sensitive substrate.

* * * * *

UNITED STATES PATENT AND TRADEMARK OFFICE
CERTIFICATE OF CORRECTION

PATENT NO. : 6,124,596
DATED : September 26, 2000
INVENTOR(S) : Mamoru Nakasuji and Shohei Suzuki It is certified that error appears in the above-identified patent and that said Letters Patent is hereby corrected as shown below:

Column 2,
Line 19, change "art)." to -- art.) --.

Column 5,
Line 22, change "lens 8, 10" to -- lens 8, 12 --.

Column 6,
Line 6, change "coil 11 are positioned " to -- coil 11 positioned --.
Line 16, change "AAC 11" to -- AAC coil 11 --.
Line 43, change "aberration.exists" to -- aberration exists -- and change "between the" to -- in the --.
Line 57, change "$R_i$"<Ri)." to -- $R_i$"<$R_i$). --.
Line 65, change "Likewise. astigmatic" to -- Likewise, astigmatic --.

Column 7,
Line 3, change "plinear d of" to -- placement of --.

Column 8,
Line 14, change "directions, may" to -- directions may --.

Column 9,
Line 6, change "5 of 51)" to -- 5 (or 51) --.
Line 10, change "to with the" to -- to the --.
Line 44, change "respectively the" to -- respectively, the --.
Line 51, change "($I_{a0}$, $I_{b0}$) ($I_{a0}$-ε, $I_{b0}$)" to -- ($I_{a0}$, $I_{b0}$), ($I_{a0}$-ε, $I_{b0}$) --.
Line 57, change equation (1) to read as follows:
-- $\Delta \equiv \{(X_2-X_1)/4-(X_{2i}-X_{1i})\}^2+\{(Y_2-Y_1)/4-(Y_{2i}-Y_{1i})\}^2$ --.

UNITED STATES PATENT AND TRADEMARK OFFICE
CERTIFICATE OF CORRECTION

PATENT NO. : 6,124,596
DATED : September 26, 2000
INVENTOR(S) : Mamoru Nakasuji and Shohei Suzuki It is certified that error appears in the above-identified patent and that said Letters Patent is hereby corrected as shown below:

<u>Column 10,</u>
Line 7, change "$I_a 32\ I_{a0}+0.4\varepsilon)$" to -- $I_a=I_{a0}+0.4\varepsilon)$, --.

Signed and Sealed this

Ninth Day of October 2001

*Attest:*

NICHOLAS P. GODICI
*Attesting Officer*     *Acting Director of the United States Patent and Trademark Office*